United States Patent
Khlat

(10) Patent No.: US 11,114,980 B2
(45) Date of Patent: Sep. 7, 2021

(54) ENVELOPE TRACKING AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 104 days.

(21) Appl. No.: 16/689,521

(22) Filed: Nov. 20, 2019

(65) Prior Publication Data

US 2020/0382062 A1    Dec. 3, 2020

Related U.S. Application Data

(60) Provisional application No. 62/854,614, filed on May 30, 2019.

(51) Int. Cl.
| | |
|---|---|
| H03F 1/30 | (2006.01) |
| H03F 1/02 | (2006.01) |
| H03F 3/213 | (2006.01) |
| H04B 1/04 | (2006.01) |
| H04B 1/16 | (2006.01) |

(52) U.S. Cl.
CPC .............. *H03F 1/02* (2013.01); *H03F 3/213* (2013.01); *H04B 1/0475* (2013.01); *H04B 1/16* (2013.01); *H03F 2200/102* (2013.01); *H03F 2200/451* (2013.01); *H04B 2001/0408* (2013.01)

(58) Field of Classification Search
CPC ........................................................ H03F 1/30
USPC .................................................. 330/297, 296
See application file for complete search history.

(56) References Cited

U.S. PATENT DOCUMENTS

| | | |
|---|---|---|
| 8,476,976 B2 | 7/2013 | Wimpenny |
| 8,718,188 B2 | 5/2014 | Balteanu et al. |
| 10,326,408 B2 | 6/2019 | Khlat et al. |
| 10,439,557 B2 | 10/2019 | Khlat et al. |
| 10,476,437 B2 | 11/2019 | Nag et al. |
| 2018/0013465 A1 | 1/2018 | Chiron et al. |
| 2020/0036337 A1 | 1/2020 | Khlat |

(Continued)

OTHER PUBLICATIONS

Non-Final Office Action for U.S. Appl. No. 16/514,051, dated Nov. 13, 2020, 9 pages.

(Continued)

*Primary Examiner* — Henry Choe
(74) *Attorney, Agent, or Firm* — Withrow & Terranova, PLLC

(57) ABSTRACT

An envelope tracking (ET) amplifier apparatus is provided. The ET amplifier apparatus includes an ET integrated circuit (ETIC) having a number of voltage circuits coupled to a common port and configured to generate an ET voltage(s) based on a number of ET target voltages, respectively. In examples discussed herein, a selected voltage circuit(s) in the ETIC receives a maximum ET target voltage among all the ET target voltages and is configured to generate a reference ET voltage based on the maximum ET target voltage. As such, another voltage circuit(s), which happens to receive the maximum ET target voltage, may simply treat the reference ET voltage as a respective ET voltage(s) instead of generating the respective ET voltage(s). As a result, it may be possible to opportunistically turn off or reduce functionality of the voltage circuit(s) to help reduce peak battery current and improve heat dissipation in the ET amplifier apparatus.

20 Claims, 4 Drawing Sheets

(56) References Cited

U.S. PATENT DOCUMENTS

2020/0382062 A1* 12/2020 Khlat .................... H03F 3/245
2021/0099135 A1* 4/2021 Balteanu ............... H03F 1/0227

OTHER PUBLICATIONS

Notice of Allowance for U.S. Appl. No. 16/549,062, dated Dec. 18, 2020, 9 pages.

* cited by examiner

US 11,114,980 B2

ENVELOPE TRACKING AMPLIFIER APPARATUS

RELATED APPLICATIONS

This application claims the benefit of provisional patent application No. 62/854,614, filed May 30, 2019, the disclosure of which is hereby incorporated herein by reference in its entirety.

This application is related to U.S. patent application Ser. No. 16/514,051, entitled "ENVELOPE TRACKING INTEGRATED CIRCUIT AND RELATED APPARATUS," filed on Jul. 17, 2019, published as U.S. Patent Application Publication No. 2020/0204116 A1, and U.S. patent application Ser. No. 16/549,062, entitled "ENVELOPE TRACKING INTEGRATED CIRCUIT AND RELATED APPARATUS," filed on Aug. 23, 2019, now U.S. Patent No. 10,978,997, the disclosures of which are hereby incorporated herein by reference in their entireties.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) new radio (NR) (5G-NR) wireless communication technology has been widely regarded as the next wireless communication standard beyond the current third-generation (3G) communication standard, such as wideband code division multiple access (WCDMA), and fourth-generation (4G) communication standard, such as long-term evolution (LTE). As such, a 5G-NR capable mobile communication device is expected to achieve significantly higher data rates, improved coverage range, enhanced signaling efficiency, and reduced latency compared to a conventional mobile communication device supporting only the 3G and 4G communication standards.

The 5G-NR capable mobile communication device can be configured to transmit a radio frequency (RF) signal(s) in a millimeter wave (mmWave) RF spectrum(s), such as an RF spectrum above 28 GHz. RF signals transmitted in the mmWave RF spectrum are susceptible to attenuation and interference. In this regard, the 5G-NR capable mobile communication device typically employs a power amplifier phase array and antenna array to shape the RF signal(s) into a directional RF beam(s) for transmission in the mmWave RF spectrum(s). Depending on the application scenarios supported by the 5G-NR capable mobile communication device, the power amplifier phase array may be configured to include from tens to hundreds of power amplifiers. Notably, power amplifiers in the power amplifier phase array can generate excessive heat when operating at suboptimal efficiency. As such, it may be desirable to improve operating efficiency of the power amplifier phase array to help reduce heat dissipation in the 5G-NR capable mobile communication device.

Envelope tracking (ET) is a power management technology designed to improve efficiency levels of the power amplifiers in the power amplifier phase array to help reduce power consumption and thermal dissipation in 5G-NR capable mobile communication devices. In an ET system, each of the power amplifiers is configured to amplify the RF signal(s) based on a time-variant ET voltage generated in accordance with a time-variant power envelope of the RF signal(s). The time-variant ET voltage increases as the time-variant power envelope rises and decreases as the time-variant power envelope falls. Understandably, the better the time-variant ET voltage tracks the time-variant power envelope, the higher efficiency can be achieved in the power amplifiers. In this regard, it may be desirable to enable ET in the 5G-NR capable mobile communication device to help improve the efficiency levels of the power amplifiers in the power amplifier phase array.

SUMMARY

Embodiments of the disclosure relate to an envelope tracking (ET) amplifier apparatus. The ET amplifier apparatus includes a number of first amplifier circuits and a number of second amplifier circuits configured to concurrently amplify a radio frequency (RF) signal for radiation via an antenna array(s). The ET amplifier apparatus includes an ET integrated circuit (IC) (ETIC) having a number of voltage circuits coupled to a common port and configured to generate an ET voltage(s) for the first amplifier circuits and the second amplifier circuits based on a number of ET target voltages, respectively. In examples discussed herein, a selected voltage circuit(s) in the ETIC receives a maximum ET target voltage among all the ET target voltages and is configured to generate a reference ET voltage based on the maximum ET target voltage. As such, another voltage circuit(s), which happens to receive the maximum ET target voltage as well, may simply treat the reference ET voltage as a respective ET voltage(s) instead of generating the respective ET voltage(s). As a result, it may be possible to opportunistically turn off or reduce functionality of the voltage circuit(s) to help reduce peak battery current and improve heat dissipation in the ET amplifier apparatus.

In one aspect, an ET amplifier apparatus is provided. The ET amplifier apparatus includes a number of first amplifier circuits having a number of first input stages and a number of first output stages, respectively. The first amplifier circuits are configured to amplify an RF signal based on at least one first ET voltage. The ET amplifier apparatus also includes a number of second amplifier circuits having a number of second input stages and a number of second output stages, respectively. The second amplifier circuits are configured to amplify the RF signal based on at least one second ET voltage. The ET amplifier apparatus also includes an ETIC. The ETIC includes a tracker circuit configured to generate a low-frequency current at a common port. The ETIC also includes a number of amplifier ports coupled to the first amplifier circuits and the second amplifier circuits. The ETIC also includes a number of voltage circuits coupled between the common port and the amplifier ports, respectively. The voltage circuits are configured to generate the at least one first ET voltage and the at least one second ET voltage based on a number of ET target voltages, respectively. A selected voltage circuit among the number of voltage circuits is configured to generate a reference ET voltage based on a maximum ET target voltage among the ET target voltages. The selected voltage circuit is also configured to provide the reference ET voltage to the common port and a selected amplifier port coupled to the selected voltage circuit among the plurality of amplifier ports.

In another aspect, an ET amplifier apparatus is provided. The ET amplifier apparatus includes a number of first amplifier circuits having a number of first input stages and a number of first output stages, respectively. The first amplifier circuits are configured to amplify an RF signal based on at least one first ET voltage. The ET amplifier apparatus also includes a number of second amplifier circuits having a number of second input stages and a number of second output stages, respectively. The second amplifier circuits are configured to amplify the RF signal based on at least one second ET voltage. The ET amplifier apparatus also includes an ETIC. The ETIC includes a tracker circuit configured to generate a low-frequency current at a common port. The ETIC also includes a number of amplifier ports coupled to the first amplifier circuits and the second amplifier circuits. The ETIC also includes a number of voltage circuits coupled between the common port and the amplifier ports, respectively. The voltage circuits are configured to generate the at least one first ET voltage and the at least one second ET voltage based on a plurality of ET target voltages, respectively. The ETIC also includes a reference voltage circuit. The reference voltage circuit is configured to generate a reference ET voltage based on a maximum ET target voltage among the ET target voltages. The reference voltage circuit is also configured to provide the reference ET voltage and the low-frequency current to the common port.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3:
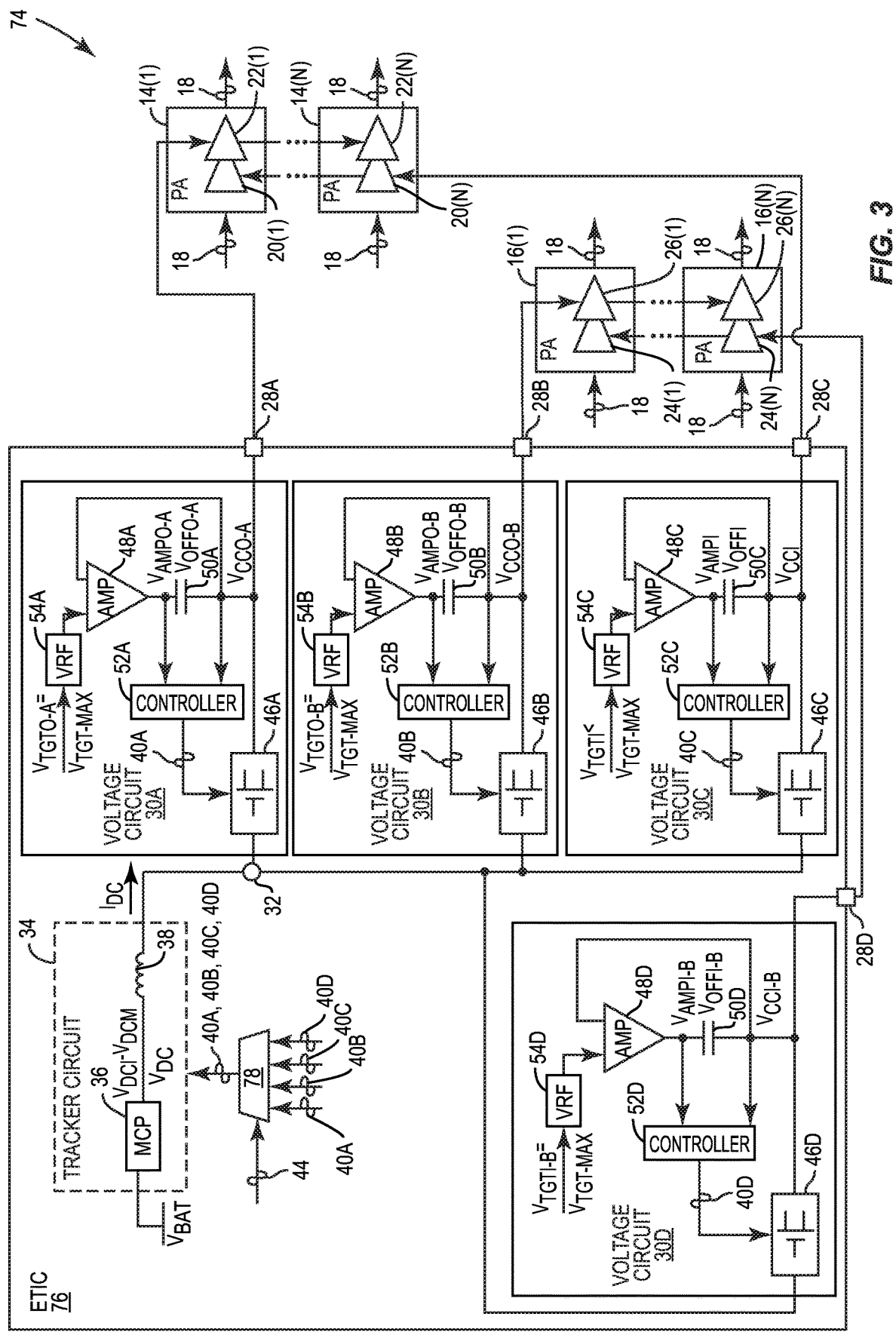
Figure 4:
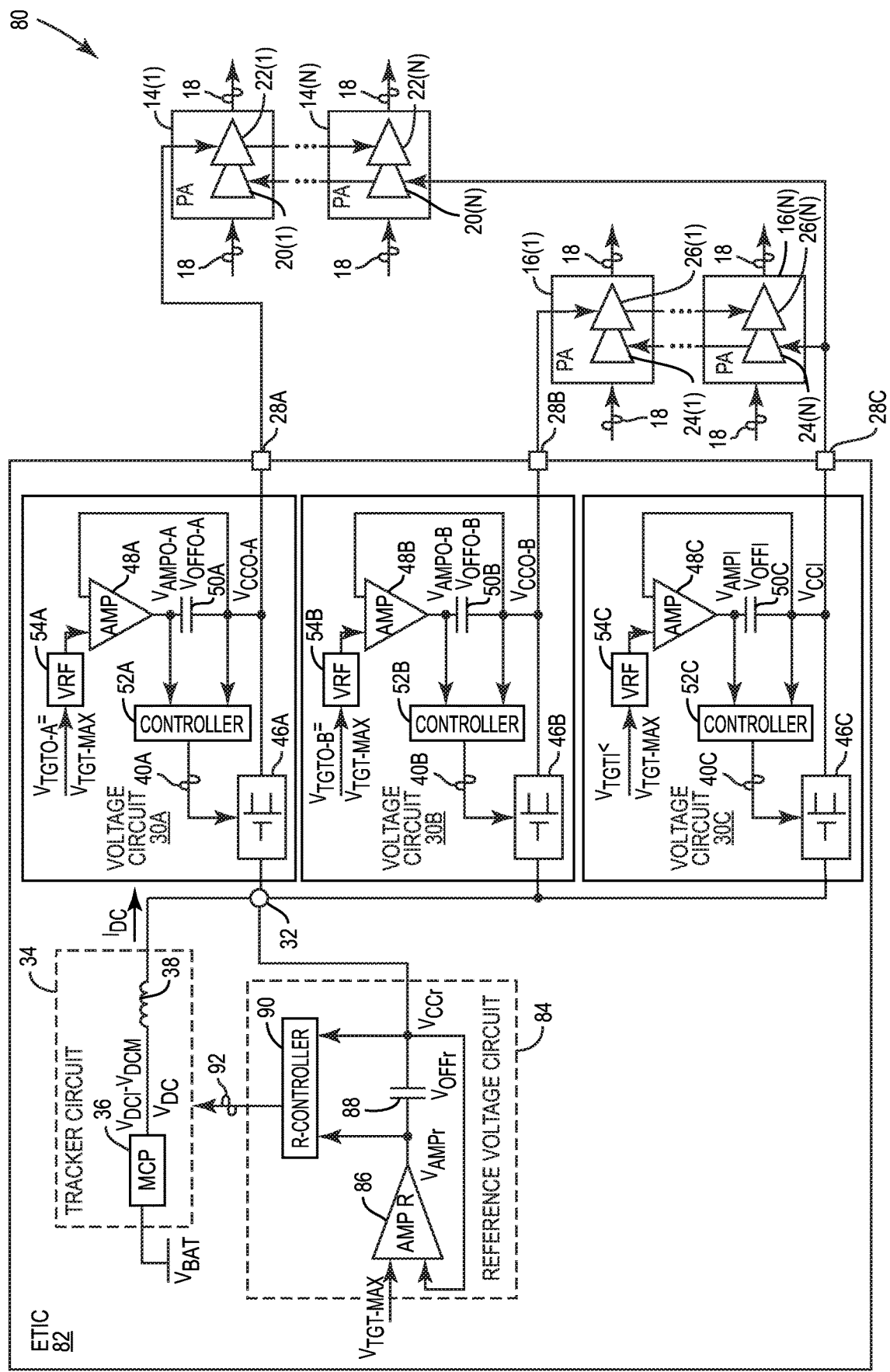

FIG. 3 is a schematic diagram of an exemplary ET amplifier apparatus in which an ETIC is configured according to another embodiment of the present disclosure to provide multiple ET voltages; and FIG. 4 is a schematic diagram of an exemplary ET amplifier apparatus in which an ETIC is configured according to another embodiment of the present disclosure to provide multiple ET voltages to multiple amplifier circuits.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) amplifier apparatus. The ET amplifier apparatus includes a number of first amplifier circuits and a number of second amplifier circuits configured to concurrently amplify a radio frequency (RF) signal for radiation via an antenna array(s). The ET amplifier apparatus includes an ET integrated circuit (IC) (ETIC) having a number of voltage circuits coupled to a common port and configured to generate an ET voltage(s) for the first amplifier circuits and the second amplifier circuits based on a number of ET target voltages, respectively. In examples discussed herein, a selected voltage circuit(s) in the ETIC receives a maximum ET target voltage among all the ET target voltages and is configured to generate a reference ET voltage based on the maximum ET target voltage. As such, another voltage circuit(s), which happens to receive the maximum ET target voltage as well, may simply treat the reference ET voltage as a respective ET voltage(s) instead of generating the respective ET voltage(s). As a result, it may be possible to opportunistically turn off or reduce functionality of the voltage circuit(s) to help reduce peak battery current and improve heat dissipation in the ET amplifier apparatus.

Figure 1:
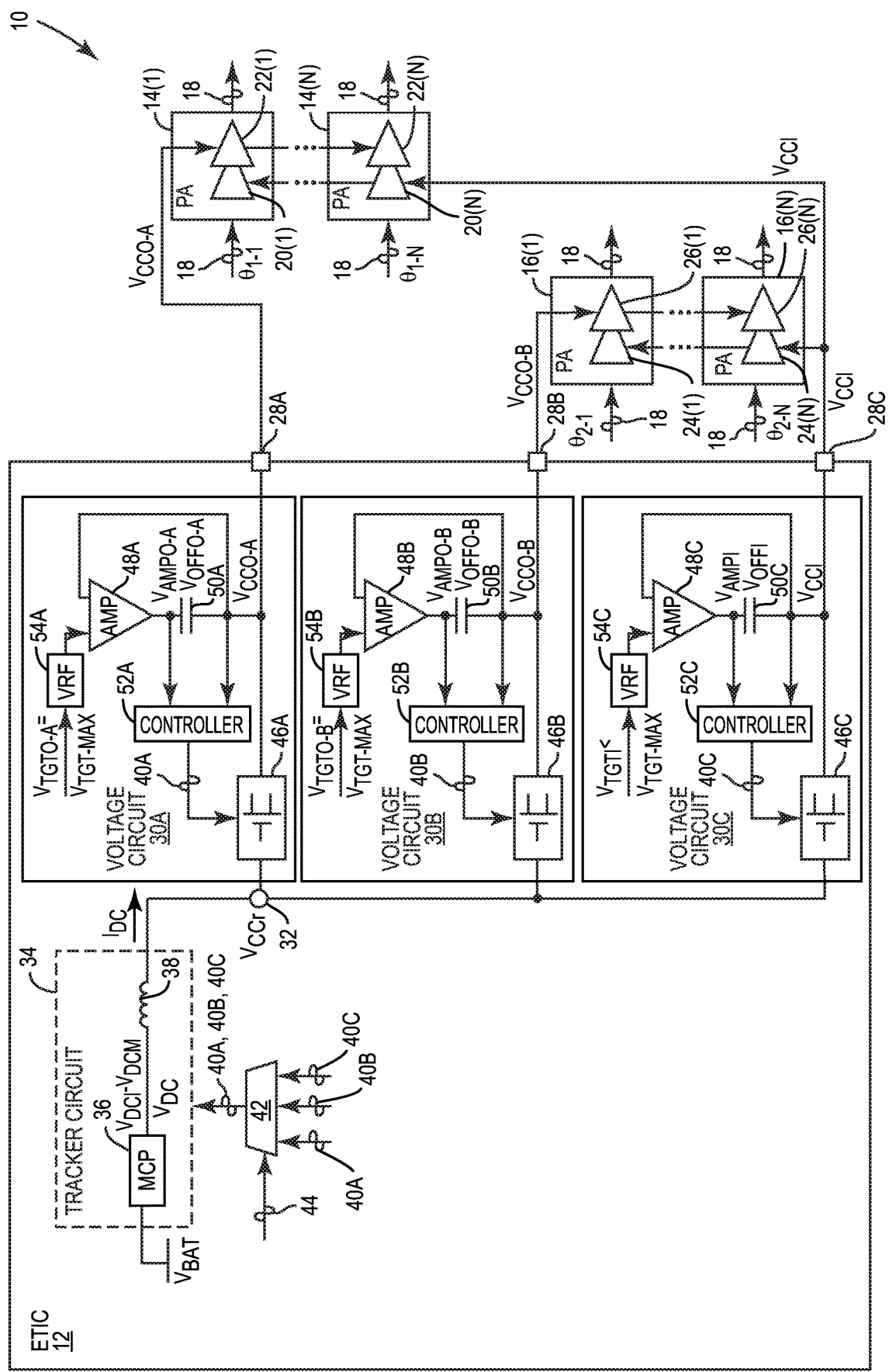
FIG. 1 is a schematic diagram of an exemplary envelope tracking (ET) amplifier apparatus in which an ET integrated circuit (ETIC) is configured according to an embodiment of the present disclosure to provide multiple ET voltages to multiple amplifier circuits.

In this regard, FIG. 1 is a schematic diagram of an exemplary ET amplifier apparatus 10 in which an ETIC 12 is configured according to an embodiment of the present disclosure to provide multiple ET voltages to multiple amplifier circuits. The ET amplifier apparatus 10 includes a number of first amplifier circuits 14(1)-14(N) and a number of second amplifier circuits 16(1)-16(N). The first amplifier circuits 14(1)-14(N) and the second amplifier circuits 16(1)-16(N) are configured to concurrently amplify an RF signal 18. In a non-limiting example, the first amplifier circuits 14(1)-14(N) are configured to amplify the RF signal 18, which may have been modulated in same or different phase terms $\theta_{1-1}$-$\theta_{1-N}$, for concurrent transmission via a first antenna array (not shown) in a first polarization (e.g., horizontal polarization). Likewise, the second amplifier circuits 16(1)-16(N) are configured to amplify the RF signal 18, which may have been modulated in same or different phase terms $\theta_{2-1}$-$\theta_{2-N}$, for concurrent transmission via a second antenna array (not shown) in a second polarization (e.g., vertical polarization) perpendicular to the first polarization. In this regard, the RF signal 18 may be concurrently radiated in different polarizations, thus enabling flexible RF beamforming in the millimeter wave (mmWave) spectrum.

In a non-limiting example, each of the first amplifier circuits 14(1)-14(N) and the second amplifier circuits 16(1)-16(N) are multi-stage amplifier circuits. In this regard, the first amplifier circuits 14(1)-14(N) include a number of first input stages 20(1)-20(N) and a number of first output stages 22(1)-22(N), respectively. The first output stages 22(1)-22(N) may be coupled respectively to the first input stages 20(1)-20(N), either directly or via an intermediate stage(s) (not shown). The first input stages 20(1)-20(N) are configured to amplify the RF signal 18 based on an input-stage ET voltage $V_{CCI}$ and provide the amplified RF signal 18 to the first output stages 22(1)-22(N), respectively. Subsequently, the first output stages 22(1)-22(N) are configured to amplify the RF signal 18 based on a first output-stage ET voltage $V_{CCO-A}$ for concurrent radiation via the first antenna array in the first polarization.

Similarly, the second amplifier circuits 16(1)-16(N) include a number of second input stages 24(1)-24(N) and a number of second output stages 26(1)-26(N), respectively. The second output stages 26(1)-26(N) may be coupled respectively to the second input stages 24(1)-24(N), either directly or via an intermediate stage(s) (not shown). The second input stages 24(1)-24(N) are configured to amplify the RF signal 18 based on the input-stage ET voltage $V_{CCI}$ and provide the amplified RF signal 18 to the second output stages 26(1)-26(N), respectively. Subsequently, the second output stages 26(1)-26(N) are configured to amplify the RF signal 18 based on a second output-stage ET voltage $V_{CCO-B}$ for concurrent radiation via the second antenna array in the second polarization.

In the embodiment discussed in FIG. 1, the ETIC 12 is configured to include a first amplifier port 28A, a second amplifier port 28B, and a third amplifier port 28C (collectively referred to as "a number of amplifier ports"). The first amplifier port 28A is coupled to the first output stages 22(1)-22(N) to provide the first output-stage ET voltage $V_{CCO-A}$ to the first output stages 22(1)-22(N). The second amplifier port 28B is coupled to the second output stages 26(1)-26(N) to provide the second output-stage ET voltage $V_{CCO-B}$ to the second output stages 26(1)-26(N). The third amplifier port 28C is coupled to the first input stages 20(1)-20(N) and the second input stages 24(1)-24(N) to provide the input-stage ET voltage $V_{CCI}$ to the first input stages 20(1)-20(N) and the second input stages 24(1)-24(N). By individually controlling the first input stages 20(1)-20(N), the second input stages 24(1)-24(N), the first output stages 22(1)-22(N), and/or the second output stages 26(1)-26(N) based on at least one first ET voltage (e.g., the input-stage ET voltage $V_{CCI}$ and the first output-stage ET voltage $V_{CCO-A}$) and at least one second ET voltage (e.g., the input-stage ET voltage $V_{CCI}$ and the second output-stage ET voltage $V_{CCO-B}$), it may be possible to maintain higher efficiencies for each of the first amplifier circuits 14(1)-14(N) and the second amplifier circuits 16(1)-16(N) to help improve heat dissipation in the ET amplifier apparatus 10.

The ETIC 12 is further configured to include a first voltage circuit 30A, a second voltage circuit 30B, and a third voltage circuit 30C (collectively referred to as "a number of voltage circuits"). The first voltage circuit 30A is coupled between a common port 32 and the first amplifier port 28A and configured to generate the first output-stage ET voltage $V_{CCO-A}$ based on a first ET target voltage $V_{TGTO-A}$. The second voltage circuit 30B is coupled between the common port 32 and the second amplifier port 28B and configured to generate the second output-stage ET voltage $V_{CCO-B}$ based on a second ET target voltage $V_{TGTO-B}$. The third voltage circuit 30C is coupled between the common port 32 and the third amplifier port 28C and configured to generate the input-stage ET voltage $V_{CCI}$ based on a third ET target voltage $V_{TGTI}$.

Notably, the first ET target voltage $V_{TGTO-A}$, the second ET target voltage $V_{TGTO-B}$, and the third ET target voltage $V_{TGTI}$ may be identical or different, depending on such factors as modulation bandwidth, peak-to-average ratio (PAR), and adjacent channel leakage ratio (ACLR) of the RF signal 18. In this regard, at least one selected voltage circuit among the first voltage circuit 30A, the second voltage circuit 30B, and the third voltage circuit 30C is configured to receive a maximum ET target voltage $V_{TGT-MAX}$ among the first ET target voltage $V_{TGTO-A}$, the second ET target voltage $V_{TGTO-B}$, and the third ET target voltage $V_{TGTI}$. For example, the first voltage circuit 30A can receive the first ET target voltage $V_{TGTO-A}$ that equals the maximum ET target voltage $V_{TGT-MAX}$ ($V_{TGTO-A}$=$V_{TGT-MAX}$) and thus generating the first ET voltage $V_{TGTO-A}$ based on the maximum ET target voltage $V_{TGT-MAX}$. In this regard, the first voltage circuit 30A may function as the selected voltage circuit to generate a reference ET voltage $V_{CCr}$ that equals the first ET voltage $V_{CCO-A}$. Accordingly, the first voltage circuit 30A may be configured to provide the first ET voltage $V_{TGTO-A}$ to the common port 32 in addition to outputting the first ET voltage $V_{TGTO-A}$ via the first amplifier port 28A (also referred to as "selected amplifier port").

In a non-limiting example, the second voltage circuit 30B receives the second ET target voltage $V_{TGTO-B}$ that happens to equal the maximum ET target voltage $V_{TGT-MAX}$ ($V_{TGTO-B}=V_{TGT-MAX}$). In this regard, the second voltage circuit 30B may be configured to receive the reference ET voltage $V_{CCr}$, which equals the first ET voltage $V_{CCO-A}$, from the common port 32 and output the reference ET voltage $V_{CCr}$ via the second amplifier port 28B as the second ET voltage $V_{CCO-B}$. As such, as discussed in detail later, the second voltage circuit 30B may operate with reduced functionality to help reduce peak battery current and improve heat dissipation in the ET amplifier apparatus 10.

In another non-limiting example, the third voltage circuit 30C receives the third ET target voltage $V_{TGTI}$ that is lower than the maximum ET target voltage $V_{TGT-MAX}$ ($V_{TGTI}<V_{TGT-MAX}$). In this regard, the third voltage circuit 30C needs to generate the third ET voltage $V_{CCI}$ at the third amplifier port 28C based on the third ET target voltage $V_{TGTI}$, as opposed to outputting the reference ET voltage $V_{CCr}$ via the third amplifier port 28C. In other words, the third voltage circuit 30C may not be able to operate with reduced functionality as does the second voltage circuit 30B.

The ETIC 12 includes a tracker circuit 34 configured to generate a low-frequency current $I_{DC}$ (e.g., a direct current) based on a battery voltage $V_{BAT}$. In a non-limiting example, the tracker circuit 34 includes a multi-level charge pump (MCP) 36 configured to generate a low-frequency voltage $V_{DC}$ (e.g., a constant voltage) at multiple voltage levels $V_{DCr}$-$V_{DCM}$ based on the battery voltage $V_{BAT}$. For example, the MCP 36 can be dynamically controlled to generate the low-frequency voltage $V_{DC}$ that equals zero-times $V_{BAT}$ ($0 \times V_{BAT}$), one-time $V_{BAT}$ ($1 \times V_{BAT}$), or two-times $V_{BAT}$ ($2 \times V_{BAT}$). The tracker circuit 34 may include a power inductor 38 coupled between the MCP 36 and the common port 32. The power inductor 38 is configured to generate the low-frequency current $I_{DC}$ based on the low-frequency voltage $V_{DC}$. Given that the MCP 36 can be controlled to generate the low-frequency voltage $V_{DC}$ at multiple voltage levels, the power inductor 38 may induce the low-frequency current $I_{DC}$ at multiple current levels accordingly.

The tracker circuit 34 may be controlled by any of the first voltage circuit 30A, the second voltage circuit 30B, and the third voltage circuit 30C to generate the low-frequency current $I_{DC}$ at a desired level. For example, the first voltage circuit 30A, the second voltage circuit 30B, and the third voltage circuit 30C can be configured to control the tracker circuit via a first control signal 40A, a second control signal 40B, and a third control signal 40C, respectively. In this regard, the ETIC 12 may be configured to include a multiplexer 42. The multiplexer 42 may be controlled by a control signal 44, which can be provided internally in the ETIC 12 or externally from a coupled transceiver circuit (not shown), to selectively output one of the first control signal 40A, the second control signal 40B, and the third control signal 40C to control the tracker circuit 34.

In a non-limiting example, the selected voltage circuit (e.g., the first voltage circuit 30A) is configured to determine the desired level of the low-frequency current $I_{DC}$ based on the maximum ET target voltage $V_{TGT-MAX}$.

The first voltage circuit 30A includes a first switching/regulating circuit 46A coupled between the common port 32 and the first amplifier port 28A. As such, the first switching/regulating circuit 46A can receive the low-frequency current $I_{DC}$ via the common port 32. The first voltage circuit 30A also includes a first voltage amplifier 48A configured to generate a first initial ET voltage $V_{AMPO-A}$ based on the first ET target voltage $V_{TGTO-A}$. The first voltage circuit 30A also includes a first offset capacitor 50A configured to raise the first initial ET voltage $V_{AMPO-A}$ by a first offset voltage $V_{OFFO-A}$ to generate the first ET voltage $V_{CCO-A}$ ($V_{CCO-A}=V_{AMPO-A}+V_{OFFO-A}$). The first voltage circuit 30A may also include a first controller 52A, which can be a field-programmable gate array (FPGA) for example, configured to generate the first control signal 40A to control the first switching/regulating circuit 46A and/or the tracker circuit 34.

The second voltage circuit 30B includes a second switching/regulating circuit 46B coupled between the common port 32 and the second amplifier port 28B. As such, the second switching/regulating circuit 46B can receive the low-frequency current $I_{DC}$ via the common port 32. The second voltage circuit 30B also includes a second voltage amplifier 48B configured to generate a second initial ET voltage $V_{AMPO-B}$ based on the second ET target voltage $V_{TGTO-B}$. The second voltage circuit 30B also includes a second offset capacitor 50B configured to raise the second initial ET voltage $V_{AMPO-B}$ by a second offset voltage $V_{OFFO-B}$ to generate the second ET voltage $V_{CCO-B}$ ($V_{CCO-B}=V_{AMPO-B}+V_{OFFO-B}$). The second voltage circuit 30B may also include a second controller 52B, which can be an FPGA for example, configured to generate the second control signal 40B to control the second switching/regulating circuit 46B and/or the tracker circuit 34.

The third voltage circuit 30C includes a third switching/regulating circuit 46C coupled between the common port 32 and the third amplifier port 28C. As such, the third switching/regulating circuit 46C can receive the low-frequency current $I_{DC}$ via the common port 32. The third voltage circuit 30C also includes a third voltage amplifier 48C configured to generate a third initial ET voltage $V_{AMPI}$ based on the third ET target voltage $V_{TGTI}$. The third voltage circuit 30C also includes a third offset capacitor 50C configured to raise the third initial ET voltage $V_{AMPI}$ by a third offset voltage $V_{OFFI}$ to generate the third ET voltage $V_{CCI}$ ($V_{CCI}=V_{AMPI}+V_{OFFI}$). The third voltage circuit 30C may also include a third controller 52C, which can be an FPGA for example, configured to generate the third control signal 40C to control the third switching/regulating circuit 46C and/or the tracker circuit 34.

In the examples discussed above, the first voltage circuit 30A receives the maximum ET target voltage $V_{TGT-MAX}$ and functions as the selected voltage circuit. In this regard, the first voltage circuit 30A may determine the desired level of the low-frequency current based on the maximum ET target voltage $V_{TGT}$-MAX and the multiplexer 42 may be controlled to output the first control signal 40A to the tracker circuit 34 to cause the low-frequency current $I_{DC}$ to be generated at the desired level. Accordingly, the first controller 52A may control the first switching/regulating circuit 46A to provide the low-frequency current $I_{DC}$ as is from the common port 32 to the first amplifier port 28A (the selected amplifier port). In contrast, if the first voltage circuit 30A receives the first ET target voltage $V_{TGTO-A}$ that is lesser than the maximum ET target voltage $V_{TGT-MAX}$, the first controller 52A may be configured to control the first switching/regulating circuit 46A to block the reference ET voltage $V_{CCr}$ and regulate the low-frequency current $I_{DC}$ based on the first output-stage ET voltage $V_{CCO-A}$. Accordingly, the first voltage circuit 30A may generate the first output-stage ET voltage $V_{CCO-A}$ at the first amplifier port 28A based on the first ET target voltage $V_{TGTO-A}$.

In the examples discussed above, the second voltage circuit 30B receives the second ET target voltage $V_{TGTO-B}$ that equals the maximum ET target voltage $V_{TGT-MAX}$ but does not function as the selected voltage circuit. In this regard, the second controller 52B may control the second switching/regulating circuit 46B to directly provide the reference ET voltage $V_{CC_r}$ and the low-frequency current $I_{DC}$ to the second amplifier port 28B. In contrast, if the second voltage circuit 30B receives the second ET target voltage $V_{TGTO-B}$ that is lesser than the maximum ET target voltage $V_{TGT-MAX}$, the second controller 52B may be configured to control the second switching/regulating circuit 46B to block the reference ET voltage $V_{CC_r}$ and regulate the low-frequency current $I_{DC}$ based on the second output-stage ET voltage $V_{CCO-B}$. Accordingly, the second voltage circuit 30B may generate the second output-stage ET voltage $V_{CCO-B}$ at the second amplifier port 28B based on the second ET target voltage $V_{TGTO-B}$.

In the examples discussed above, the third voltage circuit 30C receives the third ET target voltage $V_{TGTI}$ lesser than the maximum ET target voltage $V_{TGT-MAX}$. In this regard, the third controller 52C (also referred to as "second selected voltage circuit") may control the third switching/regulating circuit 46C to regulate (scale) the low-frequency current $I_{DC}$ based on the input-stage ET voltage $V_{CCI}$ prior to providing the low-frequency current $I_{DC}$ to the third amplifier port 28C. In addition, the third controller 52C controls the third switching/regulating circuit 46C to block the reference ET voltage $V_{CC_r}$ from the third amplifier port 28C (also referred to as "second selected amplifier port") such that the third voltage circuit 30C can output the third ET voltage $V_{CCI}$ via the third amplifier port 28C. In contrast, if the third ET target voltage $V_{TGTI}$ equals the maximum ET target voltage $V_{TGT-MAX}$, the third controller 52C may be configured to control the third switching/regulating circuit 46C to directly provide the reference ET voltage $V_{CC_r}$ and the low-frequency current $I_{DC}$ to the third amplifier port 28C.

In a non-limiting example, the first voltage circuit 30A, the second voltage circuit 30B, and the third voltage circuit 30C can be configured to further include a first target voltage processing circuit 54A (denoted as "VRF"), a second target voltage processing circuit 54B (denoted as "VRF"), and a third target voltage processing circuit 54C (denoted as "VRF"), respectively. The first target voltage processing circuit 54A, the second target voltage processing circuit 54B, and the third target voltage processing circuit 54C can be configured to preprocess (e.g., scale) the first ET target voltage $V_{TGTO-A}$, the second ET target voltage $V_{TGTO-B}$, and the third ET target voltage $V_{TGTI}$, respectively.

Figure 2:
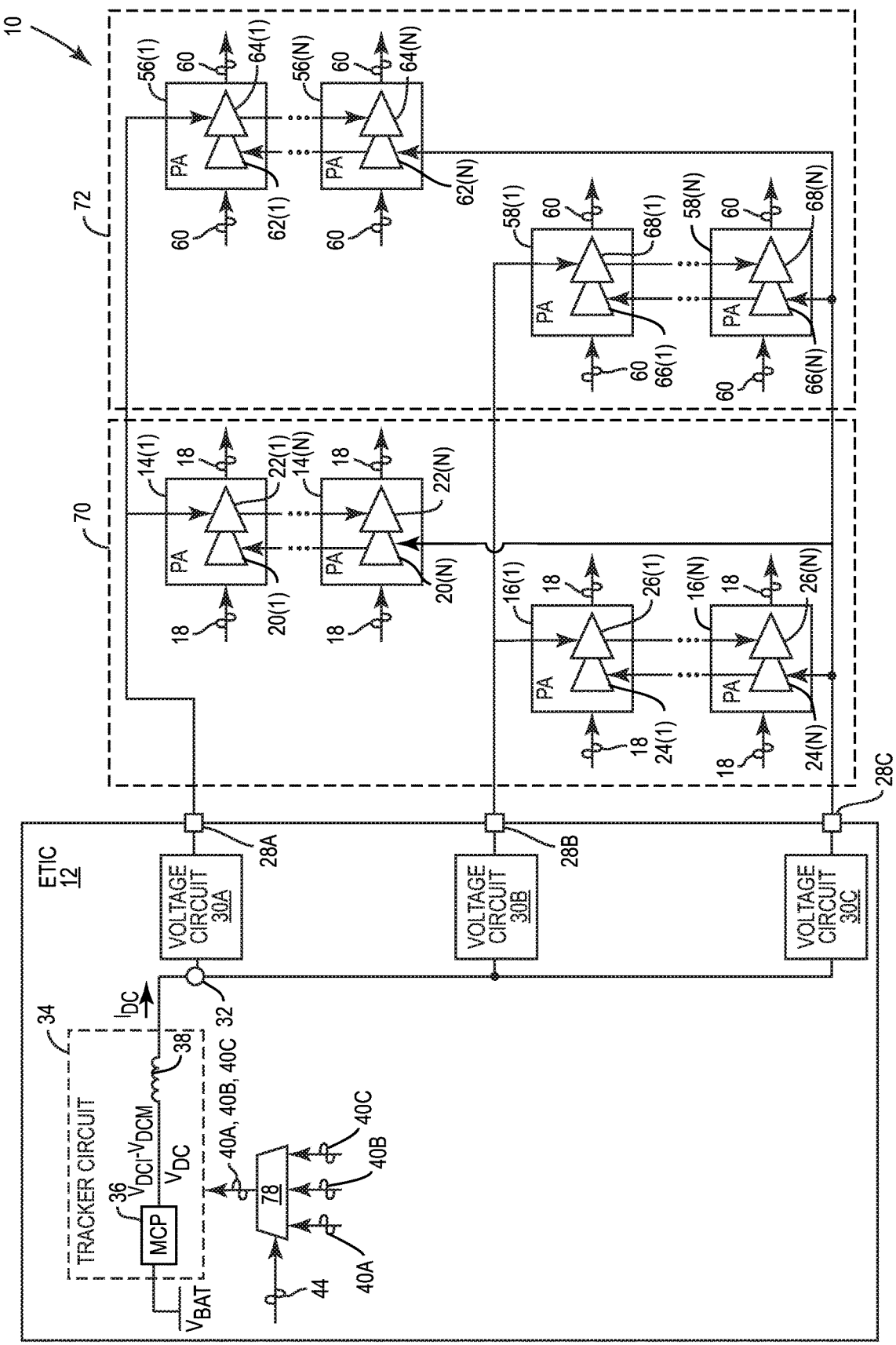
FIG. 2 is a schematic diagram providing an exemplary illustration of the ETIC in the ET amplifier apparatus of FIG. 1 configured to support additional amplifier circuits.

The ET amplifier apparatus 10 can be configured to include additional amplifier circuits for amplifying additional RF signals. In this regard, FIG. 2 is a schematic diagram providing an exemplary illustration of the ETIC 12 in the ET amplifier apparatus 10 of FIG. 1 configured to support additional amplifier circuits. Common elements between FIGS. 1 and 2 are shown therein with common element numbers and will not be re-described herein.

In a non-limiting example, the ET amplifier apparatus 10 is configured to include a number of third amplifier circuits 56(1)-56(N) and a number of fourth amplifier circuits 58(1)-58(N). The third amplifier circuits 56(1)-56(N) are configured to amplify a second RF signal 60 for radiation via a third antenna array (not shown) in the first polarization. The fourth amplifier circuits 58(1)-58(N) are configured to amplify the second RF signal 60 for radiation via a fourth antenna array (not shown) in the second polarization.

The third amplifier circuits 56(1)-56(N) include a number of third input stages 62(1)-62(N) and a number of third output stages 64(1)-64(N), respectively. The fourth amplifier circuits 58(1)-58(N) include a number of fourth input stages 66(1)-66(N) and a number of fourth output stages 68(1)-68(N), respectively. In a non-limiting example, the third input stages 62(1)-62(N) and the fourth input stages 66(1)-66(N) are configured to amplify the second RF signal 60 based on the third ET voltage $V_{CCI}$, the third output stages 64(1)-64(N) are configured to amplify the second RF signal 60 based on the first ET voltage $V_{CCO-A}$, and the fourth output stages 68(1)-68(N) are configured to amplify the second RF signal 60 based on the second ET voltage $V_{CCO-B}$.

For the convenience of distinction, the first amplifier circuits 14(1)-14(N) and the second amplifier circuits 16(1)-16(N) are collectively referred to as a first amplifier circuit cluster 70, and the third amplifier circuits 56(1)-56(N) and the fourth amplifier circuits 58(1)-58(N) are collectively referred to as a second amplifier circuit cluster 72. Notably, at any given time, the ETIC 12 can only support one of the first amplifier circuit cluster 70 and the second amplifier circuit cluster 72. In this regard, to support the second amplifier circuit cluster 72, the first amplifier circuit cluster 70 needs to be decoupled from the ETIC 12. More specifically, the ETIC 12 can be configured to decouple the first amplifier port 28A from the first output stages 22(1)-22(N), decouple the second amplifier port 28B from the second output stages 26(1)-26(N), and decouple the third amplifier port 28C from both the first input stages 20(1)-20(N) and the second input stages 24(1)-24(N). The ETIC 12 may be configured to subsequently couple the first amplifier port 28A to the third output stages 64(1)-64(N), couple the second amplifier port 28B to the fourth output stages 68(1)-68(N), and couple the third amplifier port 28C to both the third input stages 62(1)-62(N) and the fourth input stages 66(1)-66(N).

With reference back to FIG. 1, instead of providing the third ET voltage $V_{CCI}$ to both the first input stages 20(1)-20(N) and the second input stages 24(1)-24(N), it may be possible to provide different ET voltages to the first input stages 20(1)-20(N) and the second input stages 24(1)-24(N). In this regard, FIG. 3 is a schematic diagram of an exemplary ET amplifier apparatus 74 in which an ETIC 76 is configured according to another embodiment of the present disclosure to provide multiple ET voltages. Common elements between FIGS. 1 and 3 are shown therein with common element numbers and will not be re-described herein.

The primary difference between the ETIC 76 and the ETIC 12 of FIG. 1 is that the ETIC 76 further includes a fourth amplifier port 28D and a fourth voltage circuit 30D. Similar to the first voltage circuit 30A, the second voltage circuit 30B, and the third voltage circuit 30C, the fourth voltage circuit 30D includes a fourth switching/regulating circuit 46D coupled between the common port 32 and the fourth amplifier port 28D. As such, the fourth switching/regulating circuit 46D can receive the low-frequency current $I_{DC}$ via the common port 32. The fourth voltage circuit 30D also includes a fourth voltage amplifier 48D configured to generate a fourth initial ET voltage $V_{AMPI-B}$ based on a fourth ET target voltage $V_{TGTI-B}$. The fourth voltage circuit 30D also includes a fourth offset capacitor 50D configured to raise the fourth initial ET voltage $V_{AMPI-B}$ by a fourth offset voltage $V_{OFFI-B}$ to generate the fourth ET voltage $V_{CCI-B}$ ($V_{CCI-B}=V_{AMPI-B}+V_{OFFI-B}$). The fourth voltage circuit 30D may also include a fourth controller 52D, which can be an FPGA for example, configured to generate a fourth control signal 40D to control the fourth switching/regulating circuit 46D and/or the tracker circuit 34.

The ETIC 76 may be configured to include a multiplexer 78. The multiplexer 78 may be controlled by the control signal 44, which can be provided internally in the ETIC 76 or externally from a coupled transceiver circuit (not shown), to selectively output one of the first control signal 40A, the second control signal 40B, the third control signal 40C, and the fourth control signal 40D to control the tracker circuit 34.

Similar to the ET amplifier apparatus 10 in FIG. 1, the first input stages 20(1)-20(N) are coupled to the third amplifier port 28C to receive the input-stage ET voltage $V_{CCI}$ and the first output stages 22(1)-22(N) are coupled to the first amplifier port 28A to receive the first output-stage ET voltage $V_{CCO-A}$. The second input stages 24(1)-24(N) are coupled to the fourth amplifier port 28D to receive the second input-stage ET voltage $V_{CCI-B}$ and the second output stages 26(1)-26(N) are coupled to the second amplifier port 28B to receive the second output-stage ET voltage $V_{CCO-B}$. In the ET amplifier apparatus 74, the input-stage ET voltage $V_{CCI}$ and the first output-stage ET voltage $V_{CCO-A}$ may be collectively referred to at least one first ET voltage, and the second input-stage ET voltage $V_{CCI-B}$ and the second output-stage ET voltage $V_{CCO-B}$ may be collectively referred to at least one second ET voltage.

Similar to the first controller 52A, the second controller 52B, and the third controller 52C, the fourth controller 52D may be configured to control the fourth switching/regulating circuit 46D to block the reference ET voltage $V_{CCr}$ and regulate the low-frequency current $I_{DC}$ based on the second input-stage ET voltage $V_{CCI-B}$ if the fourth ET target voltage $V_{TGTI-B}$ is lesser than the maximum ET target voltage $V_{TGT-MAX}$. Accordingly, the fourth voltage circuit 30D generates the second input-stage ET voltage $V_{CCI-B}$ at the fourth amplifier port 28D based on the fourth ET target voltage $V_{TGTI-B}$. In contrast, if the fourth ET target voltage equals the maximum ET target voltage $V_{TGT-MAX}$, the fourth controller 52D may control the fourth switching/regulating circuit 46D to directly provide the low-frequency current $V_{CCr}$ and the low-frequency current $I_{DC}$ to the fourth amplifier port 28D.

With reference back to FIG. 1, instead of configuring one of the first voltage circuit 30A, the second voltage circuit 30B, and the third voltage circuit 30C to function as the selected voltage circuit to generate the reference ET voltage $V_{CCr}$, it may be possible to add a voltage circuit dedicated to generating the reference ET voltage $V_{CCr}$ based on the maximum ET target voltage $V_{TGT-MAX}$. In this regard, FIG. 4 is a schematic diagram of an exemplary ET amplifier apparatus 80 in which an ETIC 82 is configured to utilize a reference voltage circuit 84 to generate the reference ET voltage $V_{CCr}$ based on the maximum ET target voltage $V_{TGT-MAX}$. Common elements between FIGS. 1 and 4 are shown therein with common element numbers and will not be re-described herein.

The reference voltage circuit 84 includes a reference voltage amplifier 86 configured to generate an initial reference ET voltage $V_{AMPr}$ based on the maximum ET target voltage $V_{TGT-MAX}$ among the first ET target voltage $V_{TGTO-A}$, the second ET target voltage $V_{TGTO-B}$, and the third ET target voltage $V_{TGTI}$. The reference voltage circuit 84 also includes a reference offset capacitor 88 coupled between the reference voltage amplifier 86 and the common port 32. The reference offset capacitor 88 is configured to raise the initial reference ET voltage $V_{AMPr}$ by a reference offset voltage $V_{OFFr}$ to generate the reference ET voltage $V_{CCr}$ ($V_{CCr}=V_{AMPr}+V_{OFFr}$) at the common port 32. The reference voltage circuit 84 further includes a reference controller 90, which can be an FPGA for example. The reference controller 90 may be configured to determine the desired level of the low-frequency current $I_{DC}$ based on the maximum ET target voltage $V_{TGT-MAX}$ and control the tracker circuit 34 (e.g., via a signal 92) to generate the low-frequency current $I_{DC}$ at the desired level.

Each of the first controller 52A, the second controller 52B, and the third controller 52C is configured to determine whether a respective ET target voltage among the first ET target voltage $V_{TGTO-A}$, the second ET target voltage $V_{TGTO-B}$, and the third ET target voltage $V_{TGTI}$ is equal to the maximum ET target voltage $V_{TGT-MAX}$. If the respective ET target voltage equals the maximum ET target voltage $V_{TGT-MAX}$, the respective controller is configured to control a respective switching/regulating circuit among the first switching/regulating circuit 46A, the second switching/regulating circuit 46B, and the third switching/regulating circuit 46C to directly provide the reference ET voltage $V_{CCr}$ and the low-frequency current $I_{DC}$ to a respective amplifier port among the first amplifier port 28A, the second amplifier port 28B, and the third amplifier port 28C. In contrast, if the respective ET target voltage is lesser than the maximum ET target voltage $V_{TGT-MAX}$, the respective controller is configured to block the reference ET voltage $V_{CCr}$ from the respective amplifier port and regulate (e.g., scale) the low-frequency current $I_{DC}$ prior to providing the low-frequency current $I_{DC}$ to the respective amplifier port.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) amplifier apparatus comprising:
    a plurality of first amplifier circuits comprising a plurality of first input stages and a plurality of first output stages, respectively, the plurality of first amplifier circuits configured to amplify a radio frequency (RF) signal based on at least one first ET voltage;
    a plurality of second amplifier circuits comprising a plurality of second input stages and a plurality of second output stages, respectively, the plurality of second amplifier circuits configured to amplify the RF signal based on at least one second ET voltage; and
    an ET integrated circuit (IC) (ETIC) comprising:
        a tracker circuit configured to generate a low-frequency current at a common port;
        a plurality of amplifier ports coupled to the plurality of first amplifier circuits and the plurality of second amplifier circuits; and
        a plurality of voltage circuits coupled between the common port and the plurality of amplifier ports, respectively, the plurality of voltage circuits configured to generate the at least one first ET voltage and the at least one second ET voltage based on a plurality of ET target voltages, respectively;
    wherein a selected voltage circuit among the plurality of voltage circuits is configured to:
        generate a reference ET voltage based on a maximum ET target voltage among the plurality of ET target voltages; and
        provide the reference ET voltage to the common port and a selected amplifier port coupled to the selected voltage circuit among the plurality of amplifier ports.

2. The ET amplifier apparatus of claim 1 wherein the tracker circuit comprises:

a multi-level charge pump (MCP) configured to generate a low-frequency voltage at a plurality of voltage levels based on a battery voltage; and a power inductor coupled between the MCP and the common port and configured to generate the low-frequency current at the common port based on the low-frequency voltage.

3. The ET amplifier apparatus of claim 2 wherein the selected voltage circuit is further configured to:

determine a desired level of the low-frequency current based on the maximum ET target voltage;

control the MCP to generate the low-frequency voltage at a selected voltage level among the plurality of voltage levels to cause the power inductor to generate the low-frequency current at the desired level; and provide the low-frequency current to the selected amplifier port coupled to the selected voltage circuit.

4. The ET amplifier apparatus of claim 2 wherein a second selected voltage circuit among the plurality of voltage circuits is configured to:

receive a respective ET target voltage lower than the maximum ET target voltage among the plurality of ET target voltages;

block the reference ET voltage from a second selected amplifier port coupled to the second selected voltage circuit;

generate a respective ET voltage among the at least one first ET voltage and the at least one second ET voltage based on the respective ET target voltage;

provide the respective ET voltage to the second selected amplifier port coupled to the second selected voltage circuit; and regulate the low-frequency current based on the respective ET voltage.

5. The ET amplifier apparatus of claim 1 wherein:

the plurality of first amplifier circuits is coupled to a first antenna array configured to radiate the RF signal in a first polarization; and the plurality of second amplifier circuits is coupled to a second antenna array configured to radiate the RF signal in a second polarization perpendicular to the first polarization.

6. The ET amplifier apparatus of claim 1 wherein:

the plurality of amplifier ports comprises a first amplifier port coupled to the plurality of first output stages, a second amplifier port coupled to the plurality of second output stages, and a third amplifier port coupled to the plurality of first input stages and the plurality of second input stages;

the at least one first ET voltage comprises an input-stage ET voltage and a first output-stage ET voltage;

the at least one second ET voltage comprises the input-stage ET voltage and a second output-stage ET voltage; and the plurality of voltage circuits comprises a first voltage circuit, a second voltage circuit, and a third voltage circuit coupled to the first amplifier port, the second amplifier port, and the third amplifier port, respectively.

7. The ET amplifier apparatus of claim 6 wherein:

the first voltage circuit is configured to generate the first output-stage ET voltage based on a first ET target voltage among the plurality of ET target voltages;

the second voltage circuit is configured to generate the second output-stage ET voltage based on a second ET target voltage among the plurality of ET target voltages; and the third voltage circuit is configured to generate the input-stage ET voltage based on a third ET target voltage among the plurality of ET target voltages.

8. The ET amplifier apparatus of claim 7 wherein each of the first voltage circuit, the second voltage circuit, and the third voltage circuit comprise:

a respective switching/regulating circuit coupled between the common port and a respective amplifier port among the first amplifier port, the second amplifier port, and the third amplifier port; and a respective controller configured to:

control the respective switching/regulating circuit to block the reference ET voltage and regulate the low-frequency current in response to a respective ET target voltage among the first ET target voltage, the second ET target voltage, and the third ET target voltage being lesser than the maximum ET target voltage; and control the respective switching/regulating circuit to provide the reference ET voltage and the low-frequency current to a respective amplifier port among the first amplifier port, the second amplifier port, and the third amplifier port in response to the respective ET target voltage being equal to the maximum ET target voltage.

9. The ET amplifier apparatus of claim 7 further comprising:

a plurality of third amplifier circuits comprising a plurality of third input stages and a plurality of third output stages coupled to the plurality of third input stages, respectively; and a plurality of fourth amplifier circuits comprising a plurality of fourth input stages and a plurality of fourth output stages coupled to the plurality of fourth input stages, respectively;

wherein the ETIC is further configured to:

decouple the first amplifier port from the plurality of first output stages and couple the first amplifier port to the plurality of third output stages;

decouple the second amplifier port from the plurality of second output stages and couple the second amplifier port to the plurality of fourth output stages; and decouple the third amplifier port from the plurality of first input stages and the plurality of second input stages and couple the third amplifier port to the plurality of third input stages and the plurality of fourth input stages.

10. The ET amplifier apparatus of claim 1 wherein:

the plurality of amplifier ports comprises a first amplifier port coupled to the plurality of first output stages, a second amplifier port coupled to the plurality of second output stages, a third amplifier port coupled to the plurality of first input stages, and a fourth amplifier port coupled to the plurality of second input stages;

the at least one first ET voltage comprises an input-stage ET voltage and a first output-stage ET voltage;

the at least one second ET voltage comprises a second input-stage ET voltage and a second output-stage ET voltage; and the plurality of voltage circuits comprises a first voltage circuit, a second voltage circuit, a third voltage circuit, and a fourth voltage circuit coupled to the first amplifier port, the second amplifier port, the third amplifier port, and the fourth amplifier port, respectively.

11. The ET amplifier apparatus of claim 10 wherein:
the first voltage circuit is configured to generate the first output-stage ET voltage based on a first ET target voltage among the plurality of ET target voltages;
the second voltage circuit is configured to generate the second output-stage ET voltage based on a second ET target voltage among the plurality of ET target voltages;
the third voltage circuit is configured to generate the input-stage ET voltage based on a third ET target voltage among the plurality of ET target voltages; and
the fourth voltage circuit is configured to generate the second input-stage ET voltage based on a fourth ET target voltage among the plurality of ET target voltages.

12. The ET amplifier apparatus of claim 11 wherein each of the first voltage circuit, the second voltage circuit, the third voltage circuit, and the fourth voltage circuit comprise:
a respective switching/regulating circuit coupled between the common port and a respective amplifier port among the first amplifier port, the second amplifier port, the third amplifier port, and the fourth amplifier port; and
a respective controller configured to:
control the respective switching/regulating circuit to block the reference ET voltage and regulate the low-frequency current in response to a respective ET target voltage among the first ET target voltage, the second ET target voltage, the third ET target voltage, and the fourth ET target voltage being lesser than the maximum ET target voltage; and
control the respective switching/regulating circuit to provide the reference ET voltage and the low-frequency current to a respective amplifier port among the first amplifier port, the second amplifier port, the third amplifier port, and the fourth amplifier port in response to the respective ET target voltage being equal to the maximum ET target voltage.

13. An envelope tracking (ET) amplifier apparatus comprising:
a plurality of first amplifier circuits comprising a plurality of first input stages and a plurality of first output stages, respectively, the plurality of first amplifier circuits configured to amplify a radio frequency (RF) signal based on at least one first ET voltage;
a plurality of second amplifier circuits comprising a plurality of second input stages and a plurality of second output stages, respectively, the plurality of second amplifier circuits configured to amplify the RF signal based on at least one second ET voltage; and
an ET integrated circuit (IC) (ETIC) comprising:
a tracker circuit configured to generate a low-frequency current at a common port;
a plurality of amplifier ports coupled to the plurality of first amplifier circuits and the plurality of second amplifier circuits;
a plurality of voltage circuits coupled between the common port and the plurality of amplifier ports, respectively, the plurality of voltage circuits configured to generate the at least one first ET voltage and the at least one second ET voltage based on a plurality of ET target voltages, respectively; and
a reference voltage circuit configured to:
generate a reference ET voltage based on a maximum ET target voltage among the plurality of ET target voltages; and
provide the reference ET voltage and the low-frequency current to the common port.

14. The ET amplifier apparatus of claim 13 wherein the tracker circuit comprises:
a multi-level charge pump (MCP) configured to generate a low-frequency voltage at a plurality of voltage levels based on a battery voltage; and
a power inductor coupled between the MCP and the common port and configured to generate the low-frequency current at the common port based on the low-frequency voltage.

15. The ET amplifier apparatus of claim 14 wherein the reference voltage circuit is further configured to:
determine a desired level of the low-frequency current based on the maximum ET target voltage; and
control the MCP to generate the low-frequency voltage at a selected voltage level among the plurality of voltage levels to cause the power inductor to generate the low-frequency current at the desired level.

16. The ET amplifier apparatus of claim 13 wherein a selected voltage circuit among the plurality of voltage circuits is configured to:
receive a respective ET target voltage that equals the maximum ET target voltage among the plurality of ET target voltages; and
provide the reference ET voltage and the low-frequency current directly to a selected amplifier port coupled to the selected voltage circuit.

17. The ET amplifier apparatus of claim 13 wherein a selected voltage circuit among the plurality of voltage circuits is configured to:
receive a respective ET target voltage lower than the maximum ET target voltage among the plurality of ET target voltages;
block the reference ET voltage from a selected amplifier port coupled to the selected voltage circuit;
generate a respective ET voltage among the at least one first ET voltage and the at least one second ET voltage based on the respective ET target voltage;
provide the respective ET voltage to the selected amplifier port coupled to the selected voltage circuit; and
regulate the low-frequency current based on the respective ET voltage.

18. The ET amplifier apparatus of claim 13 wherein:
the plurality of first amplifier circuits is coupled to a first antenna array configured to radiate the RF signal in a first polarization; and
the plurality of second amplifier circuits is coupled to a second antenna array configured to radiate the RF signal in a second polarization perpendicular to the first polarization.

19. The ET amplifier apparatus of claim 18 wherein:
the plurality of amplifier ports comprises a first amplifier port coupled to the plurality of first output stages, a second amplifier port coupled to the plurality of second output stages, and a third amplifier port coupled to the plurality of first input stages and the plurality of second input stages;
the plurality of ET target voltages comprises a first ET target voltage, a second ET target voltage, and a third ET target voltage;
the at least one first ET voltage comprises an input-stage ET voltage and a first output-stage ET voltage;
the at least one second ET voltage comprises the input-stage ET voltage and a second output-stage ET voltage; and
the plurality of voltage circuits comprises a first voltage circuit, a second voltage circuit, and a third voltage circuit coupled to the first amplifier port, the second amplifier port, and the third amplifier port, respectively, wherein the first voltage circuit, the second voltage circuit, and the third voltage circuit are configured to generate the first output-stage ET voltage, the second output-stage ET voltage, and the input-stage ET voltage based on the first ET target voltage, the second ET target voltage, and the third ET target voltage, respectively.

20. The ET amplifier apparatus of claim 19 wherein each of the first voltage circuit, the second voltage circuit, and the third voltage circuit comprises:
   a respective switching/regulating circuit coupled between the common port and a respective amplifier port among the first amplifier port, the second amplifier port, and the third amplifier port; and
   a respective controller configured to:
      control the respective switching/regulating circuit to block the reference ET voltage and regulate the low-frequency current in response to a respective ET target voltage among the first ET target voltage, the second ET target voltage, and the third ET target voltage being lesser than the maximum ET target voltage; and
      control the respective switching/regulating circuit to provide the reference ET voltage and the low-frequency current to a respective amplifier port among the first amplifier port, the second amplifier port, and the third amplifier port in response to the respective ET target voltage being equal to the maximum ET target voltage.

* * * * *